(12) United States Patent
Renau et al.

(10) Patent No.: US 10,903,211 B1
(45) Date of Patent: Jan. 26, 2021

(54) GATE DEVICES AND METHODS OF FORMATION USING ANGLED IONS

(71) Applicant: APPLIED Materials, Inc., Santa Clara, CA (US)

(72) Inventors: Anthony Renau, West Newbury, MA (US); Min Gyu Sung, Essex, MA (US); Sony Varghese, Manchester, MA (US); Morgan Evans, Manchester, MA (US); Naushad K. Variam, Marblehead, MA (US); Tassie Andersen, Salem, MA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 16/542,658

(22) Filed: Aug. 16, 2019

(51) Int. Cl.
| | |
|---|---|
| *H01L 27/08* | (2006.01) |
| *H01L 27/088* | (2006.01) |
| *H01L 29/06* | (2006.01) |
| *H01L 29/78* | (2006.01) |
| *H01L 29/66* | (2006.01) |

(52) U.S. Cl.
CPC ...... *H01L 27/0886* (2013.01); *H01L 29/0653* (2013.01); *H01L 29/0669* (2013.01); *H01L 29/6681* (2013.01); *H01L 29/785* (2013.01); *H01L 2029/7858* (2013.01)

(58) Field of Classification Search
CPC H01L 27/0886; H01L 29/0669; H01L 29/785
See application file for complete search history.

(56) References Cited

U.S. PATENT DOCUMENTS

| | | | |
|---|---|---|---|
| 10,607,847 B1* | 3/2020 | Sung | H01L 29/0673 |
| 2019/0378934 A1* | 12/2019 | Hsiao | H01L 21/823821 |

OTHER PUBLICATIONS

Vladimir Tuboltsev, "Sculpturing Nanowires with Ion Beams", Small, 5 No. 23, Wiley-VCH Verlag GmbH & Co. 2009, pp. 2687-2691. (Year: 2009).*

* cited by examiner

*Primary Examiner* — William Coleman
(74) *Attorney, Agent, or Firm* — Kacvinsky Daisak Bluni PLLC

(57) ABSTRACT

The present disclosure is directed to structures and processing for three-dimensional transistor devices. In some approaches, a method may include providing a plurality of fin structures formed from a substrate, the plurality of fin structures disposed subjacent to a hard mask layer, and directing angled ions at the plurality of fin structures. The angled ions may form a non-zero angle of incidence with respect to a perpendicular to a plane of the substrate, wherein the angled ions etch the plurality of fin structures to form a stack of isolated nanowires within the plurality of fin structures. The method may further include removing the hard mask layer, and forming a stopping layer over the stack of isolated nanowires.

20 Claims, 11 Drawing Sheets

GATE DEVICES AND METHODS OF FORMATION USING ANGLED IONS

FIELD

The present embodiments relate to semiconductor device structures, and more particularly, to structures and processing for three-dimensional transistor devices.

BACKGROUND

As semiconductor devices scale to smaller dimensions, the ability to harness device improvements with decreased size becomes more challenging. The synthesis of three-dimensional semiconductor transistors, such as fin type field effect transistors (finFET), gate-all-around transistor devices (GAA), or horizontal gate all around (HGAA) transistor devices involves challenging processing issues. HGAA structures are often referred to as a nanosheet device because the HGAA transistor formation entails formation of multi-layers of nanometer-thick sheets of two different semiconductor materials grown in an epitaxial heterostructure. An example is a Si/SiGe superlattice stack composed of alternating silicon and silicon germanium alloy (SiGe) layers, and arranged in a vertical configuration having an overall fin shape. The formation of final HGAA structures according to known techniques involves selectively removing the silicon germanium layer (in the case of silicon devices), to form nanowire structures made of silicon, from which structures, the HGAA transistor is fabricated.

These known approaches entail several drawbacks, including limits on the number of nanowires possible. A larger number of nanowires requires a high fin aspect ratio, which may result in an unstable structure unstable. Another drawback is the difficulty forming an inner spacer module, which does not exist in conventional finFET flows. Another drawback is defect generation of strained Si nano-wire grown on SiGe during Si/SiGe supper lattice formation, which results in a low device yield. Another drawback is the difficulty performing Si/SiGe intermixing with hot He implantation for STI densification. Another drawback is the difficulty making SiGe channel for PFET.

With respect to these and other considerations, the present disclosure is provided.

SUMMARY OF THE DISCLOSURE

In view of the foregoing, what is needed are gate devices and methods for forming using angled ions. In one approach, a method of forming a three-dimensional transistor device includes providing a plurality of fin structures formed from a substrate, the plurality of fin structures disposed subjacent to a hard mask layer, and directing angled ions at the plurality of fin structures. The angled ions form a non-zero angle of incidence with respect to a perpendicular to a plane of the substrate, wherein the angled ions etch the plurality of fin structures to form a stack of isolated nanowires within the plurality of fin structures. The method may further include removing the hard mask layer, and forming a stopping layer over the stack of isolated nanowires.

In another approach, a method of forming a gate device may include providing a plurality of fin structures formed from a substrate, the plurality of fin structures disposed subjacent to a hard mask layer, providing a source trench isolation (STI) material over the plurality of fin structures, and directing angled ions at the STI material and the plurality of fin structures to form a stack of isolated nanowires within the plurality of fin structures. The angled ions etch the plurality of fin structures at a non-zero angle of incidence with respect to a perpendicular to a plane of the substrate. The method may further include removing the hard mask layer and the STI material, and forming a stopping layer over the stack of isolated nanowires following removal of the hard mask layer and the STI material.

In yet another approach, a semiconductor device may include a substrate and a stack of isolated nanowires disposed over the substrate, each of the stack of isolated nanowires extending between first and second portions of a spacer. The semiconductor device may further include a replacement metal gate disposed over the stack of isolated nanowires, wherein a metal of the replacement metal gate is disposed in between each nanowire of the stack of isolated nanowires.

Figure 1A:
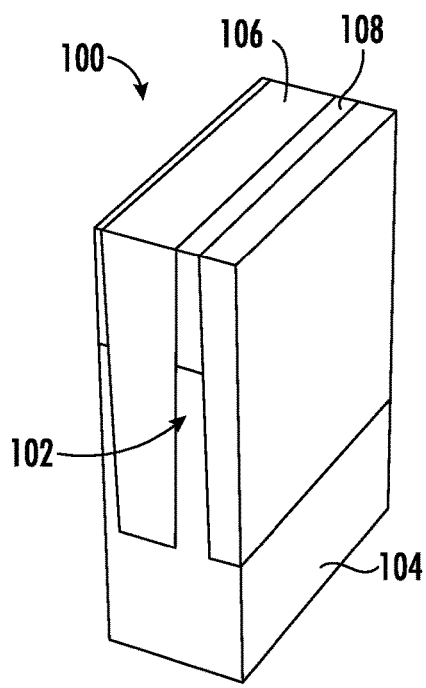
FIGS. 1A-1B depict side perspective views of a device including a set of fin structures in accordance with embodiments of the present disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Devices and methods in accordance with the present disclosure will now be described more fully hereinafter with reference to the accompanying drawings, where embodiments of the methods are shown. The devices and methods may be embodied in many different forms and are not to be construed as being limited to the embodiments set forth herein. Instead, these embodiments are provided so this disclosure will be thorough and complete, and will fully convey the scope of the system and method to those skilled in the art.

The present embodiments provide novel techniques to form semiconductor devices, including three-dimensional transistors, formed in a semiconductor substrate. As is known, three dimensional transistors, such as HGAA transistors, may be arranged in circuitry to form various types of logic devices, as well as memory devices. An HGAA structure as disclosed herein may be implemented in a metal oxide semiconductor (MOS) transistor device, include a CMOS device architecture, where both NFET nanowire and PFET nanowire devices are formed, from vertical stacks of nanowires. These stacks may be referred to herein as "nanowire stacks," where a nanowire stack of a first polarity may be a P-type nanowire stack, and a nanowire stack of a second polarity may be an N-type nanowire stack.

Figure 1B:
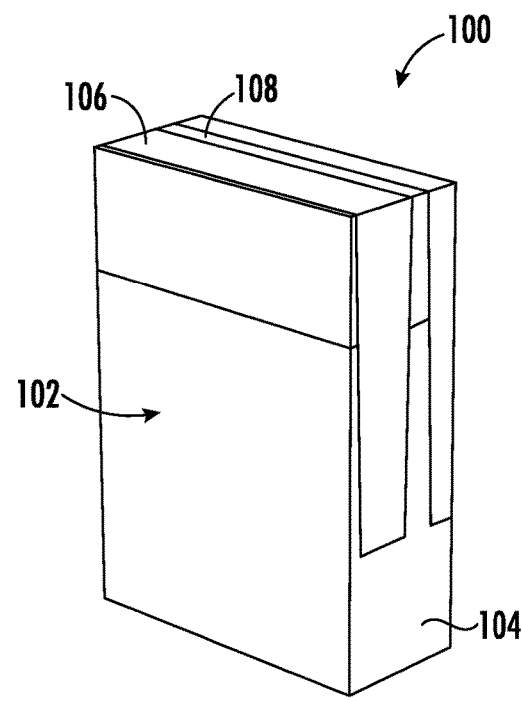

Turning now to FIGS. 1A-B, cross-sectional views of a device 100 (e.g., a finFET semiconductor device) according to embodiments of the disclosure will be described. As shown, the device 100 may include a plurality of fin structures 102 formed from a substrate 104, which may be bulk or monocrystalline silicon. A source trench isolation (STI) material 106, such as silicon dioxide ($SiO_2$) may be formed between each of the fin structures 102, while a hard mask layer 108, such as silicon nitride (SiN), may be formed atop each of the fin structures 102. In some embodiments, the STI material 106 is a blanket insulator, such as flowable oxide.

In some embodiments, the substrate 104 has been patterned to generate a the plurality of fin structures 102. In some non-limiting embodiments, the height of the fin structures 102 may range from 50 nm to 300 nm. The plurality of fin structures 102 may be formed by known lithography and etch processes where the hard mask layer 108 permits selective etching to the substrate 104 when exposed to a known reactive ion etching process. As such, the hard mask layer 108 may be segmented into isolated portions, extending over the fin structures 102.

The term "substrate" as used herein is intended to include a semiconductor substrate, a semiconductor epitaxial layer deposited or otherwise formed on a semiconductor substrate and/or any other type of semiconductor body, and all such structures are contemplated as falling within the scope of the present embodiments. For example, the semiconductor substrate may comprise a semiconductor wafer (e.g., silicon, SiGe, or an SOI wafer) or one or more die on a wafer, and any epitaxial layers or other type semiconductor layers formed there over or associated therewith. A portion or entire semiconductor substrate may be amorphous, polycrystalline, or single-crystalline. In addition to the aforementioned types of substrates, the semiconductor substrate employed in the present embodiments may also comprise a hybrid oriented (HOT) semiconductor substrate having surface regions of different crystallographic orientation. The semiconductor substrate may be doped, undoped, or contain doped regions and undoped regions therein. The semiconductor substrate may contain regions with strain and regions without strain therein, or contain regions of tensile strain and compressive strain.

Figure 2A:
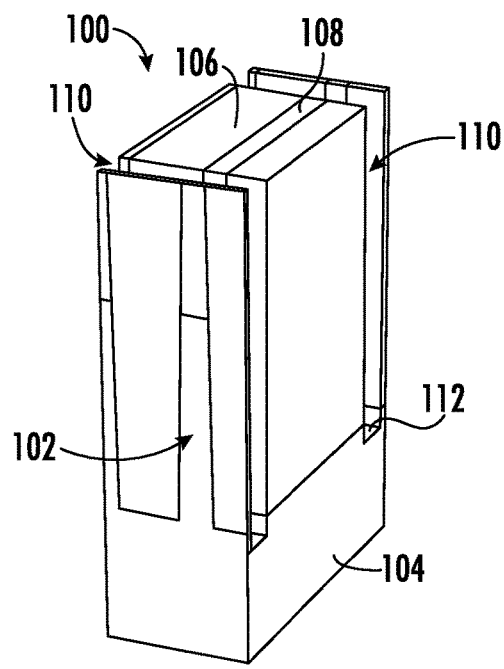
FIGS. 2A-2B depict side perspective views of the device following a fin cut in accordance with embodiments of the present disclosure.
Figure 2B:
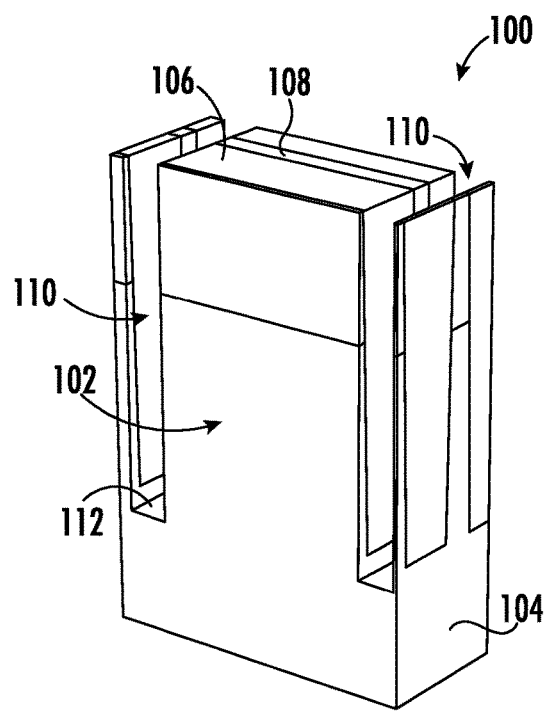

As shown in FIGS. 2A-B, a fin cut may be performed to create a set of trenches 110 in the device 100. As shown, the set of trenches 110 may be formed through the STI material 106 and the fin structures 102, selective to an upper surface 112 of the substrate 104. In other embodiments the set of trenches 110 are also formed selective to the fin structures 102. As shown, the set of trenches 110 may also be formed through the hard mask layer 108. In some embodiments, the trenches 110 are formed using one or more etch processes, such as a reactive ion etch (RIE).

Figure 3A:
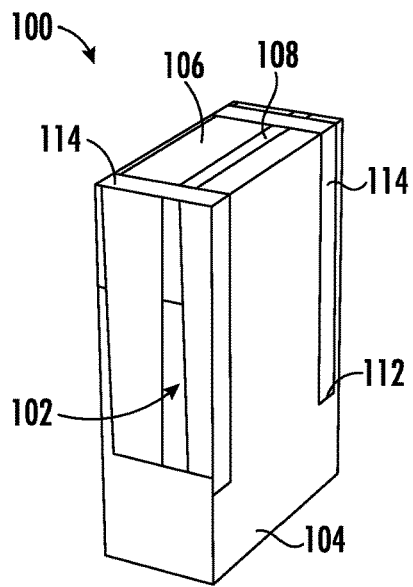
FIGS. 3A-3B depict side perspective views of the device after a dielectric material is deposited into a set of trenches in accordance with embodiments of the present disclosure.
Figure 3B:
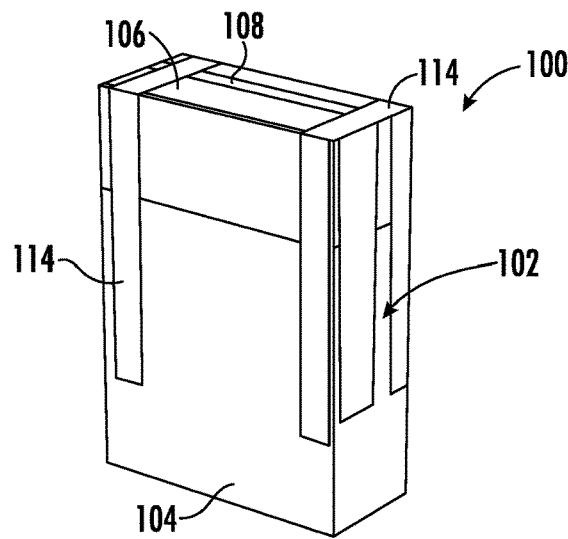

In FIGS. 3A-3B, a dielectric material 114 may then be deposited into the set of trenches 110, and then planarized to the configuration shown. Although non-limiting, the dielectric material 114 may be a silicon nitride (SiN) deposited within the set of trenches 110. In some embodiments, the dielectric material 114 may be recessed to the hard mask layer 108 using chemical mechanical planarization (CMP). As shown, the dielectric material 114 may extend to the upper surface 112 of the substrate 104.

Figure 4A:
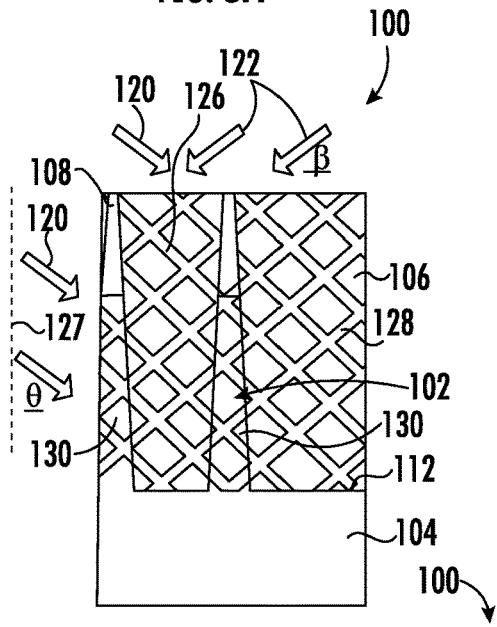
FIGS. 4A-4B depict side cross-sectional views of the device after formation of trenches in accordance with embodiments of the present disclosure.
Figure 4B:
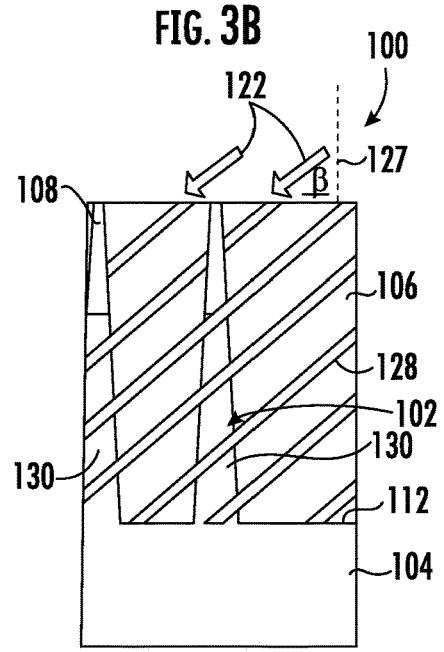

Turning now to FIGS. 4A-4B, an approach for forming a stack of isolated nanowires (hereinafter "nanowires") will be described in greater detail. At this stage, angled ions are directed at the plurality of fins 102 and the STI material 106. In this example, the angled ions comprise first angled ions 120, directed at a first non-zero angle of incidence $\theta$ with respect to a perpendicular 127 to a plane corresponding to the upper surface 112 of the substrate 104. The angled ions also include second angled ions 122, directed at a second non-zero angle of incidence $\beta$ with respect to the perpendicular 127, opposite the first non-zero angle of incidence $\theta$. Although non-limiting, for practical applications, the absolute value for the angle of incidence (+/− with respect to the perpendicular 127) of angled ions may range between 10 degrees and 80 degrees, and in particular embodiments between 10 degrees and 50 degrees. The embodiments are not limited in this context.

In the operation of FIG. 4A, the angled ions may be directed in a reactive ion beam etching operation (RIE), where first angled ions 120 and second angled ions 122 are provided as ion beams for performing reactive ion etching. Alternatively, the RIE may be performed in only a single direction (e.g., using the second angled ions 122), as shown in FIG. 4B. In both cases, the semiconductor material of the fin structures 102 may be preferentially etched with respect to the hard mask layer 108. The STI material 106 may also be preferentially etched with respect to the hard mask layer 108. Thus, in embodiments where the hard mask layer 108 is silicon nitride, the fin structures 102 are silicon, and the STI material 106 is oxide, a known reactive ion etching recipe may be used to selectively etch oxide and silicon with respect to silicon nitride. As such, at least a portion of the hard mask layer 108 and the dielectric material 114 (not shown) may be preserved during the processes of FIGS. 4A-4B.

As further shown, the first angled ions 120 and the second angled ions 122 form trenches 126 and trenches 128, respectively. The trenches 126, 128 are angled trenches, tending to etch through the fin structures 102 and the STI material 106 at a non-zero angle. In some embodiments, the trenches 126, 128 extend only to the upper surface 112 of the substrate 104. In other embodiments, the trenches 126, 128 may remove a portion of the substrate 104. Because the hard mask layer 108 is etched at a much slower rate than the STI material 106 and fin structures 102, the presence of the individual portions of the mask layer 108 act to shadow subjacent regions in the device 100. This shadowing results in defining the width of the trenches 126 and trenches 128. Notably, while just two portions of the hard mask layer 108 are shown in the examples of FIGS. 4A-4B, other portions of the hard mask layer 108, extending over other fin structures 102 (not shown) are assumed to be present. The trenches 126, 128 may etch the fin structures 102 to the extent that a stack of isolated semiconductor regions, or nanowires 130, have been formed in the fin structures 102. As shown, each of the nanowires 130 extends perpendicular to one another.

Figure 4C:
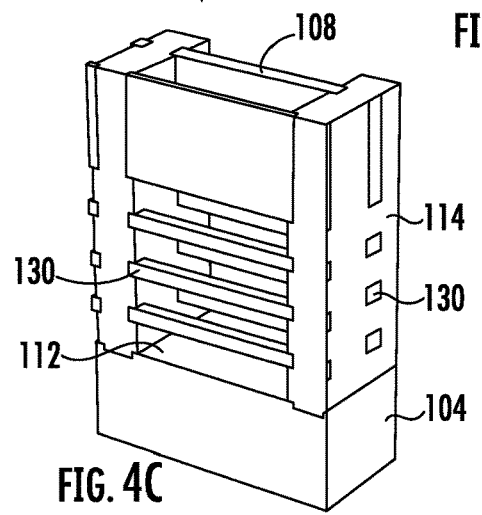
FIG. 4C depicts a perspective view of the device including a plurality of nanowires in accordance with embodiments of the present disclosure.

As shown in FIG. 4C, once the nanowires 130 have been formed, the STI material 106 may be removed from the device 100, including from between each of the nanowires 130. As shown, the STI material 106 may be removed selective to the hard mask layer 108, the substrate 104, and the nanowires 130. In some embodiments, the STI material 106 may be removed using a hydrofluoric (HF) acid etch.

Figure 5A:
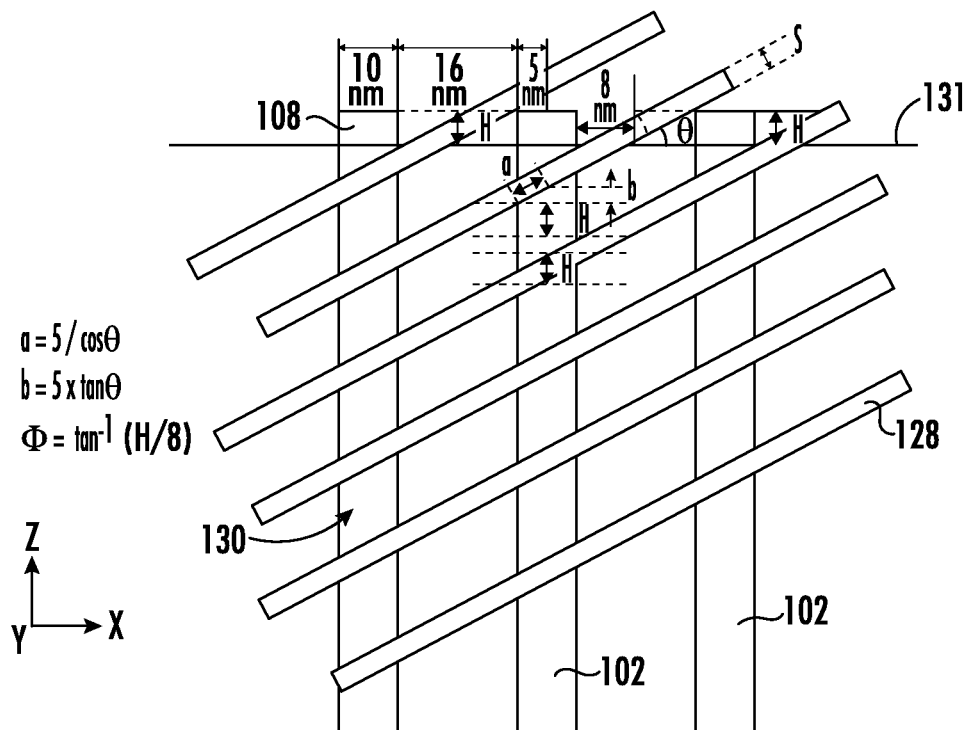
FIG. 5A depicts a perspective view of the device including a plurality of nanowires in accordance with embodiments of the present disclosure.
Figure 5B:
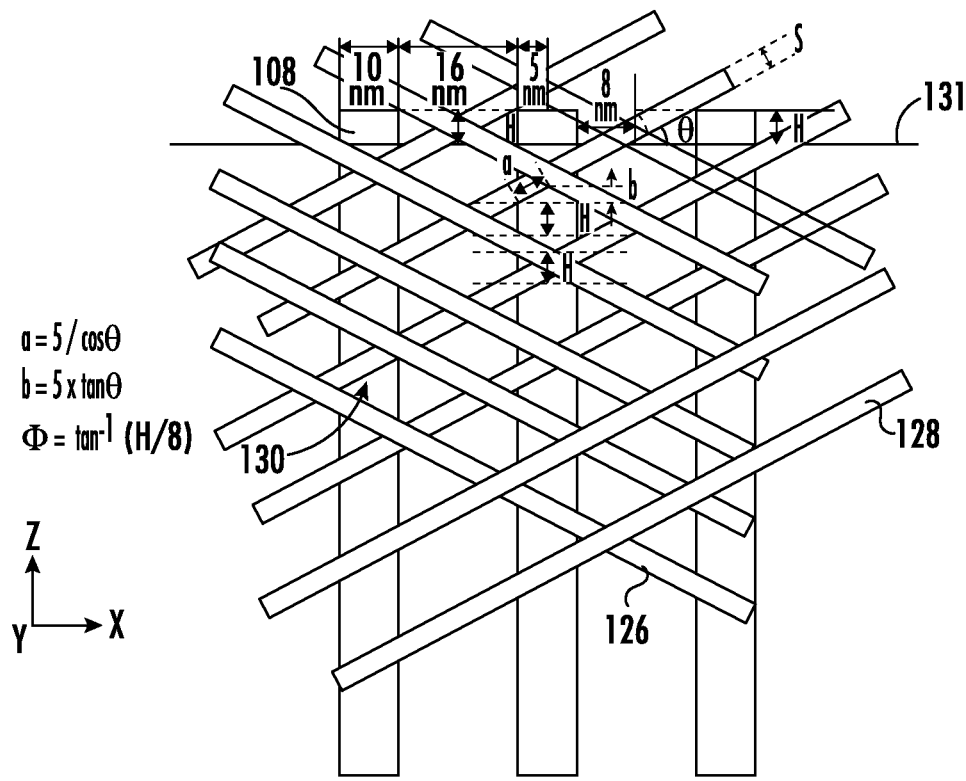
FIG. 5B depicts a perspective view of the device including a plurality of nanowires in accordance with embodiments of the present disclosure.

FIGS. 5A-5B depicts details of the geometry for forming a nanowire assembly using angled ions according to embodiments of the disclosure. FIG. 5A depicts a single angled RIE, while FIG. 5B depicts a dual angled RIE. The trenches 126, 128 may be formed by ion beams, which etch through the STI material (e.g., oxide) 106 and the fin structures 102. Due to a shadowing effect of the hard mask 108, multiple ion beam lines are created (e.g., in one direction as shown in FIG. 5A and in two directions as shown in FIG. 5B) when etching the STI material 106 and the fin structures 102. The etching dissects the silicon of the fin structures 102, resulting in multiple nanowires 130.

For clarity, some trenches of the trenches 126 and trenches 128 are omitted, while parts of the trenches are shown extending above the actual substrate top surface 131. FIGS. 5A-5B highlight the fact that the angle of inclination θ of the trenches 126 or trenches 128 (which angle may be equivalent to the non-zero angle of inclination θ of the first angled ions 120 and the non-zero angle of inclination θ of the second angled ions 122) is defined by the height H of the isolated patterning features of the hard mask layer 108, as well as the pitch between adjacent stacks of the nanowires 130 along the X-direction. In some specific non-limiting examples, explicitly shown in FIGS. 5A-5B, the pitch may be assumed to be 26 nm, while the width of the nanowires 130 is 10 nm. With this geometry, θ may be determined based upon a triangle formed having a side equal to half the width between adjacent nanowire stacks, which value is 8 nm (=(26−10)/2). The other side of the right triangle is the height. Thus, θ is calculated as the tan−1 (H/8 nm), where H is in nanometers.

Table I below provides exemplary values θ for different values of H, (e.g., from 10 nm to 30 nm) assuming a 10 nm width of nanowires 130 and pitch of 26 nm. Depending upon the selectivity of etching of the hard mask layer 108 with respect to the subjacent materials, such as silicon and silicon oxide, a lesser or greater height of the hard mask layer 108 may be called for. As shown, the value of θ decreases for increasing H, becoming quite steep, just 15 degrees from perpendicular for 30 nm height. This steeper angle entails a greater etch depth along the Z-axis to form three nanowires, as also shown in Table I. In particular, the etch depth required to create N number of the nanowires 130 (along the Z-direction)=((N+1)×Fin pitch)/cos θ.

TABLE I

| H(nm) | Θ(degree) | a(nm) | b(nm) | Etch depth (nm) for 3 nano wires |
|---|---|---|---|---|
| 10 | 51.3 | 8 | 6.2 | 167 |
| 20 | 88 | 13.5 | 12.3 | 281 |
| 30 | 75 | 20 | 18.6 | 400 |

Figure 6A:
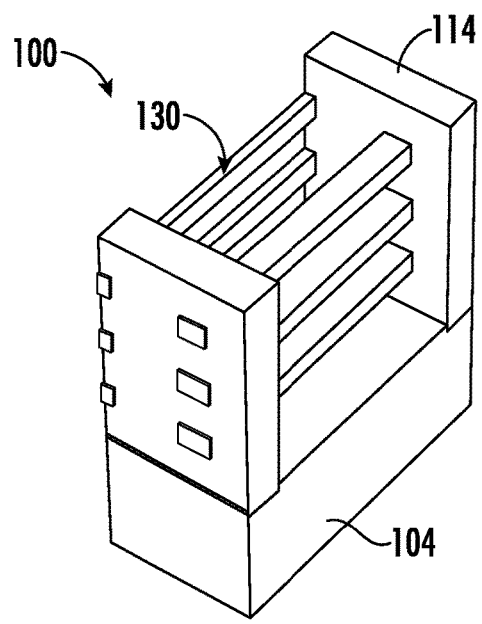
FIGS. 6A-6B depict side perspective views of the device after removal of a hard mask layer in accordance with embodiments of the present disclosure.
Figure 6B:
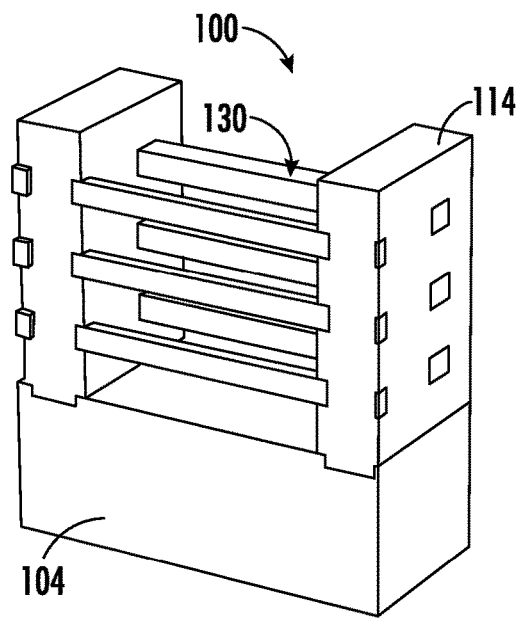
Figure 7A:
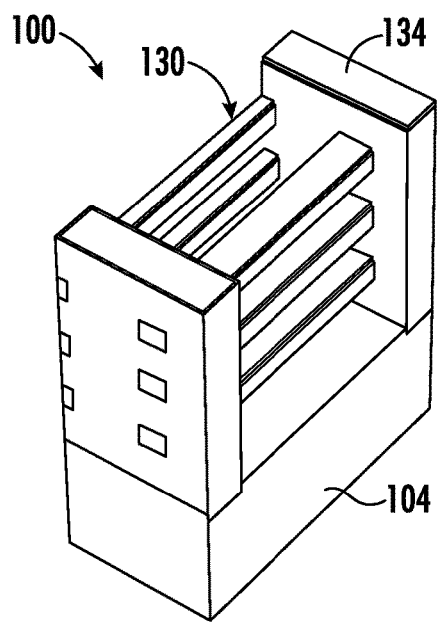
FIGS. 7A-7B depict side perspective views of the device after formation of a stopping layer in accordance with embodiments of the present disclosure.
Figure 7B:
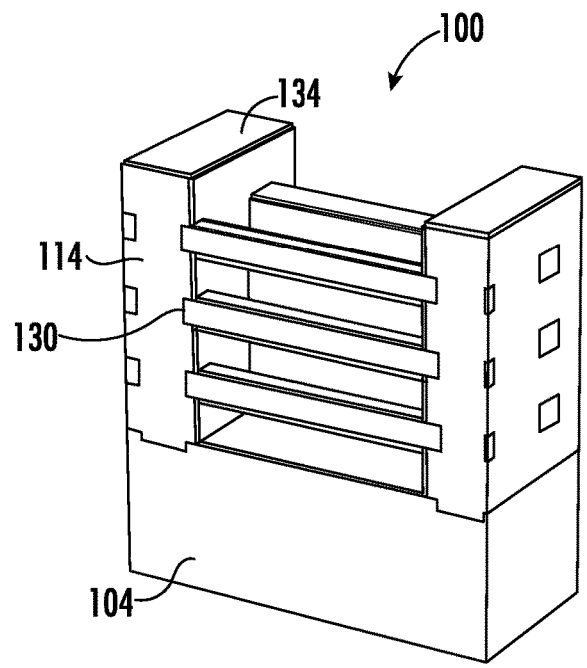

As demonstrated in FIGS. 6A-6B, the hard mask layer 108 may then be removed from the device 100, and a stopping layer 134 may be formed over the exposed surfaces of the device 100, including over each of the nanowires 130, as shown in FIGS. 7A-7B. In some embodiments, the hard mask layer 108 may be removed via CMP. In some embodiments, the stopping layer 134 may be SiO$_2$.

Figure 8A:
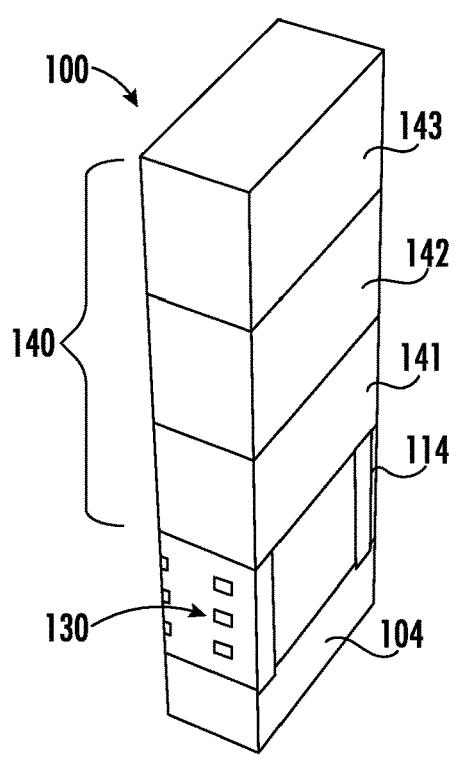
FIGS. 8A-10B depict side perspective views of the device after formation and processing of a gate stack in accordance with embodiments of the present disclosure.
Figure 8B:
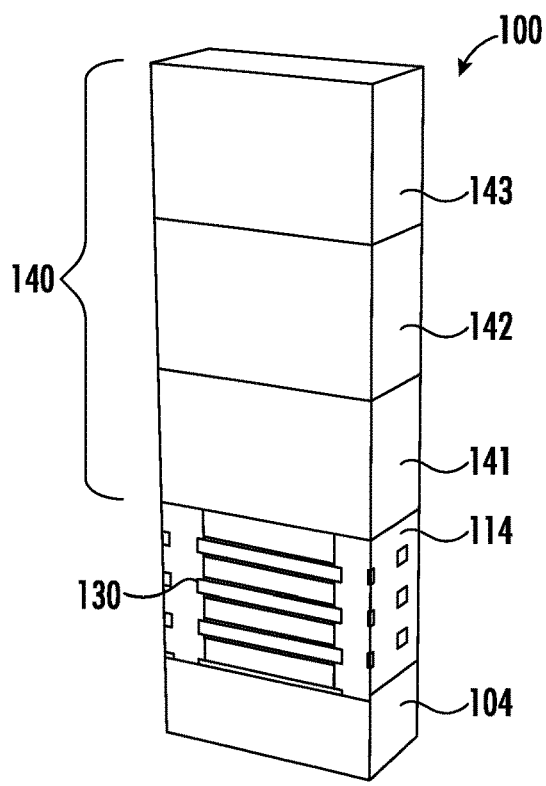

As shown in FIGS. 8A-8B, a gate stack 140 may then be formed over the device 100. In some embodiments, the gate stack 140 includes a dummy pull layer 141 (e.g., polysilicon) formed over the stopping layer 134 and the nanowires 130, a masking layer 142 (e.g., SiN) atop the dummy pull layer 141, and an oxide layer 143 (e.g., SiO$_2$) atop the masking layer 142. In some embodiments, the dummy pull layer 141 may be may be formed from various materials including, but not limited to, boron carbide (BC), a silicon boron carbide material that contains nitrogen (i.e., SiB:C (N)), carbon (C), compressed carbon, and SiO$_2$. As shown, the dummy pull layer 141 may be formed in between each of the nanowires 130.

Figure 9A:
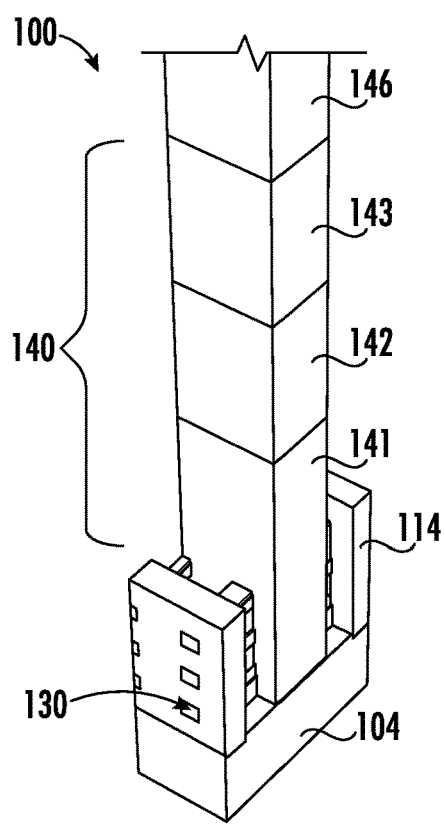
Figure 9B:
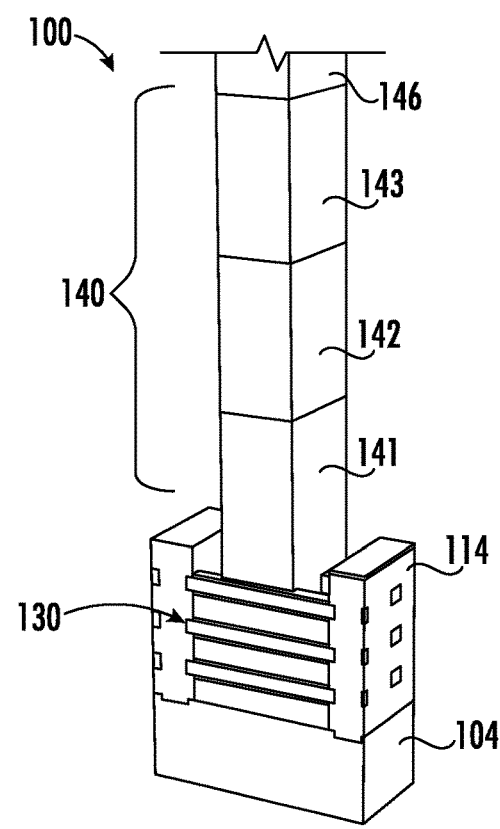
Figure 10A:
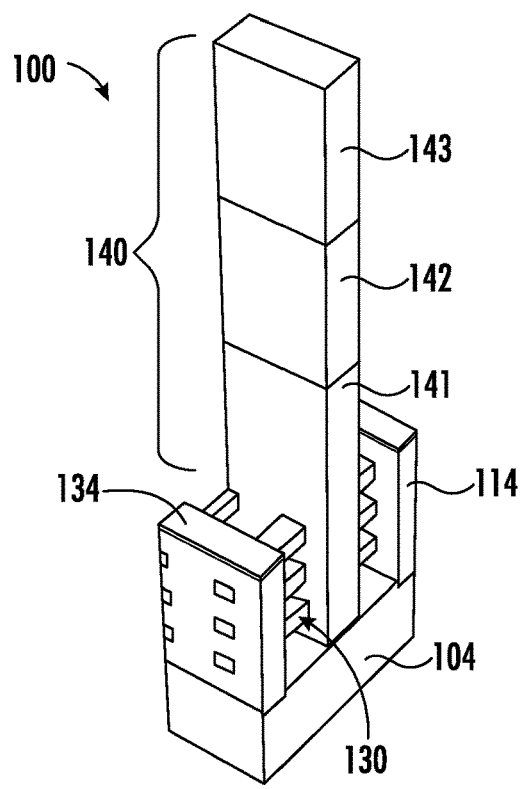
Figure 10B:
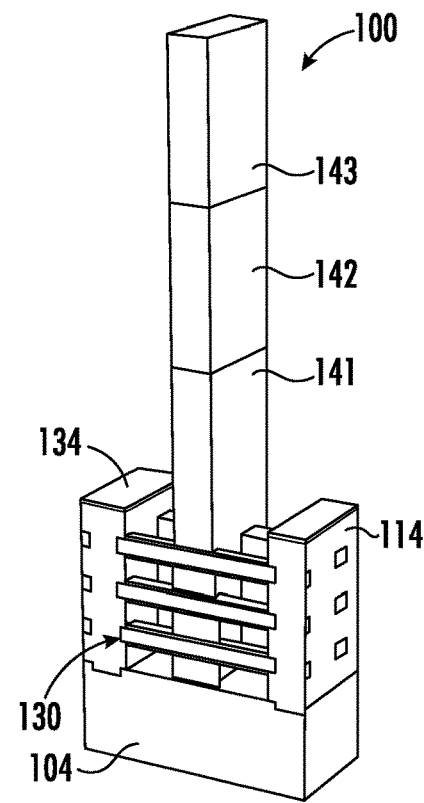

As shown in FIGS. 9A-9B, a blocking layer 146 may be formed over the gate stack 140, and the gate stack 140 removed selective to the stopping layer 134 formed over the nanowires 130. In some embodiments, the gate stack 140 is removed using a RIE. The blocking mask 146 may be removed, and the gate stack 140 further processed, as shown FIGS. 10A-10B. In some embodiments, the gate poly remaining underneath the nanowires 130 may be removed using an isotropic RIE, or by oxidation together with a buffered hydrofluoric acid (BHF). As shown, the dummy pull layer 141 of the gate stack 140 may be removed selective to the stopping layer 134 and there can be a gate length reduction during the poly Si removal located under the nanowires 130, which can be compensated during gate lithography process.

Figure 11A:
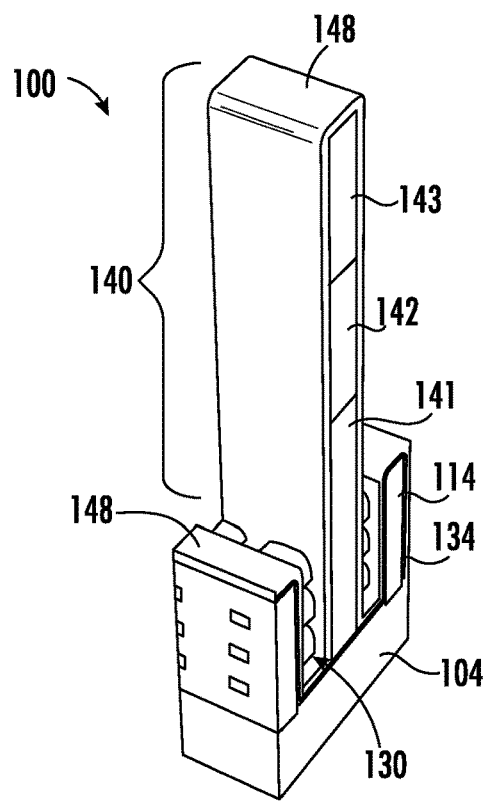
FIGS. 11A-11B depict side perspective views of the device after formation a spacer in accordance with embodiments of the present disclosure.
Figure 11B:
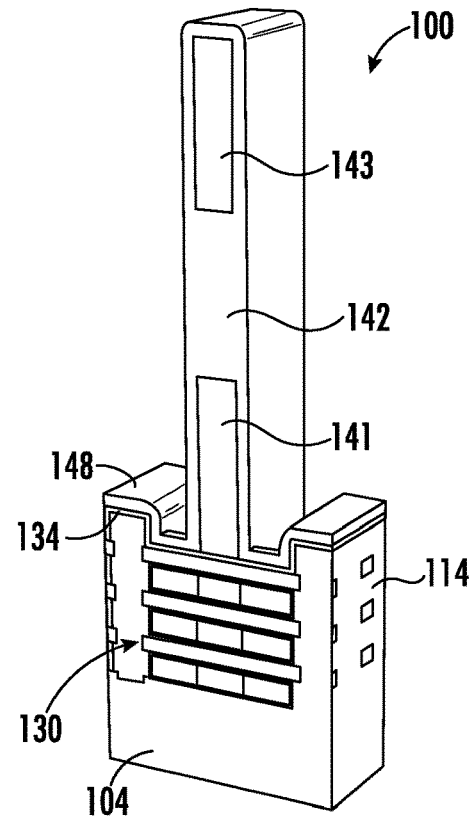

As shown in FIGS. 11A-11B, a spacer 148 may be formed over the device 100, including over the nanowires 130 and the gate stack 140. In some embodiments, the spacer 148 may be conformally deposited SiN. Although non-limiting, in other embodiments, the spacer 148 may alternatively be a high-temperature stable siliconborocarbonitride (SiBCN), Silicon-Boron-Carbon-Nitride (SiBCN), or Silicon-Oxygen-Carbon-Nitride (SiOCN).

Figure 12A:
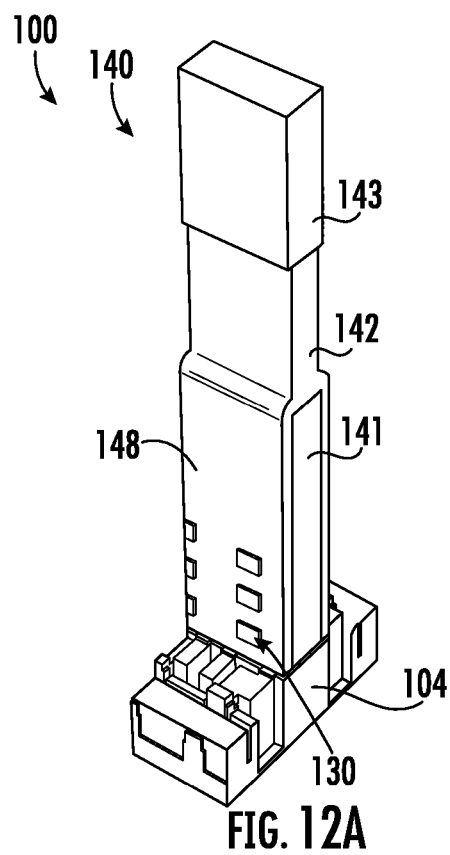
FIGS. 12A-12B depict side perspective views of the device after the spacer and portions of the nanowires extending adjacent the gate stack are removed in accordance with embodiments of the present disclosure.
Figure 12B:
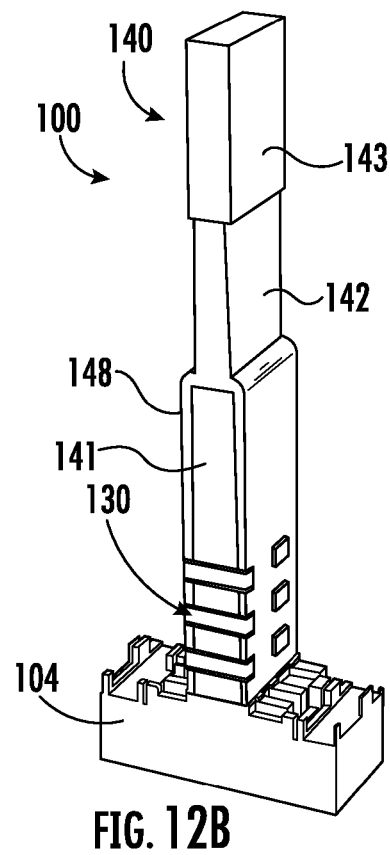

Next, as shown in FIGS. 12A-12B, the spacer 148 and a portion of the nanowires 130 extending adjacent the gate stack 140 are removed. In some embodiments, the spacer 148 may be removed from the oxide layer 143 and the masking layer 142. Furthermore, the dielectric material 114 and portions of the substrate 104 may also be removed. As shown, the spacer 148 may remain along the dummy pull layer 141, however.

Figure 13A:
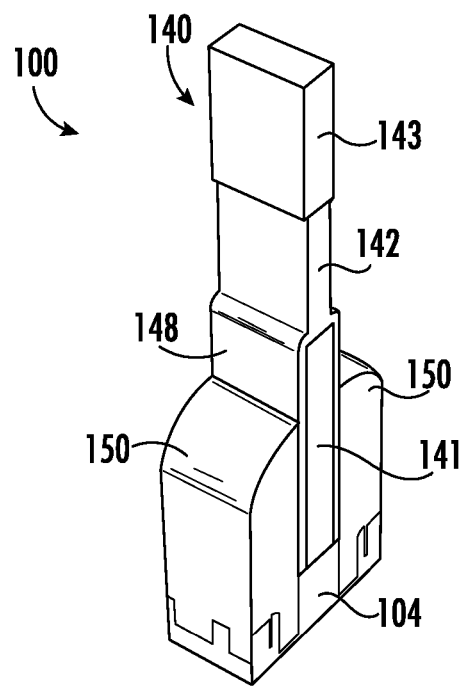
FIGS. 13A-13B depict side perspective views of the device after formation of source/drain regions in accordance with embodiments of the present disclosure.
Figure 13B:
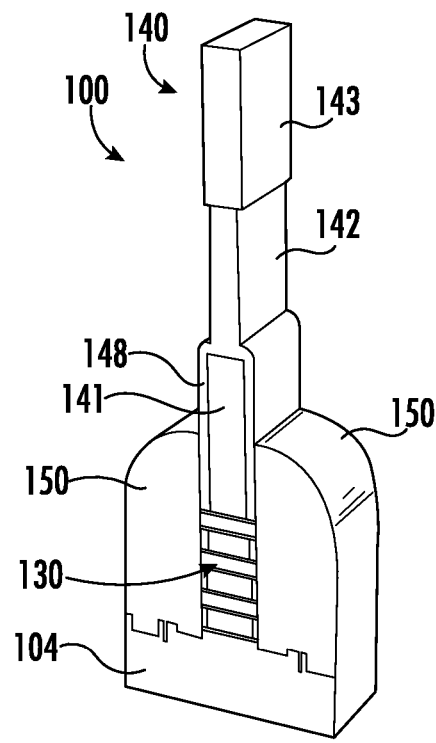
Figure 14A:
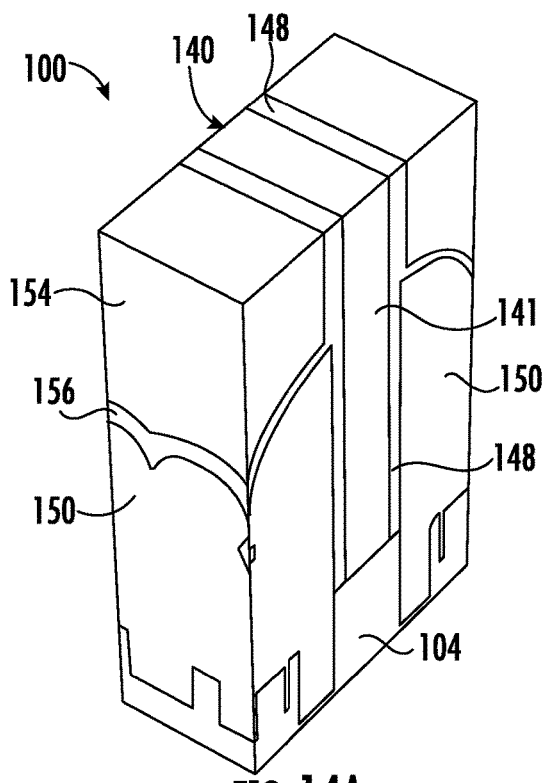
FIGS. 14A-14B depict side perspective views of the device after formation of an oxide layer over the source/drain regions in accordance with embodiments of the present disclosure.
Figure 14B:
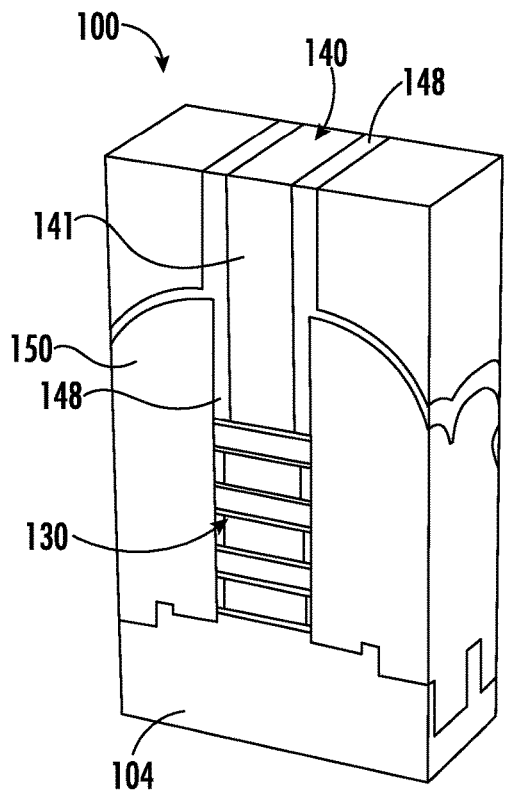

As shown in FIGS. 13A-13B, source/drain regions 150 may then be formed adjacent the gate stack 140 and the nanowires 130. In some embodiments, the source/drain regions 150 may be SiGe or SiP epitaxially grown to a desired configuration. An oxide layer 154 (e.g., $SiO_2$) may then be deposited over the source/drain regions 150 and planarized, as shown in FIGS. 14A-14B. In some embodiments, a SiN layer 156 may be formed over the source/drain regions 150, wherein the oxide layer 154 is deposited atop the SiN layer 156.

Figure 15A:
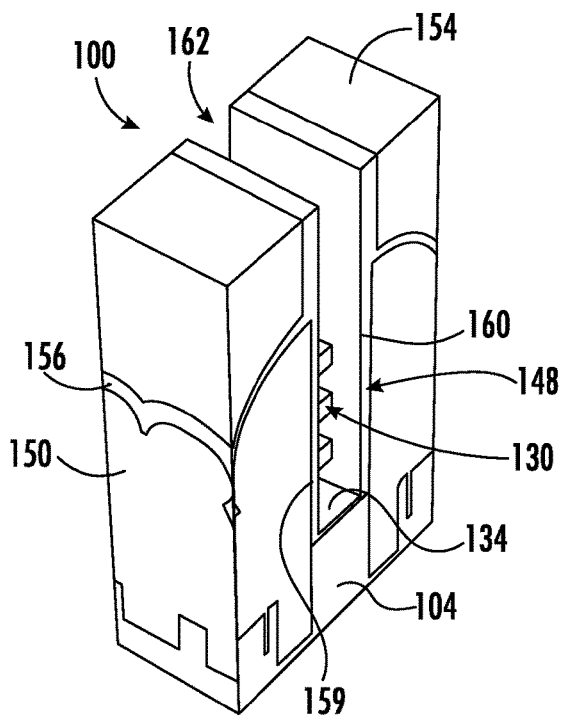
FIGS. 15A-15B depict side perspective views of the device after a dummy poly pull in accordance with embodiments of the present disclosure.
Figure 15B:
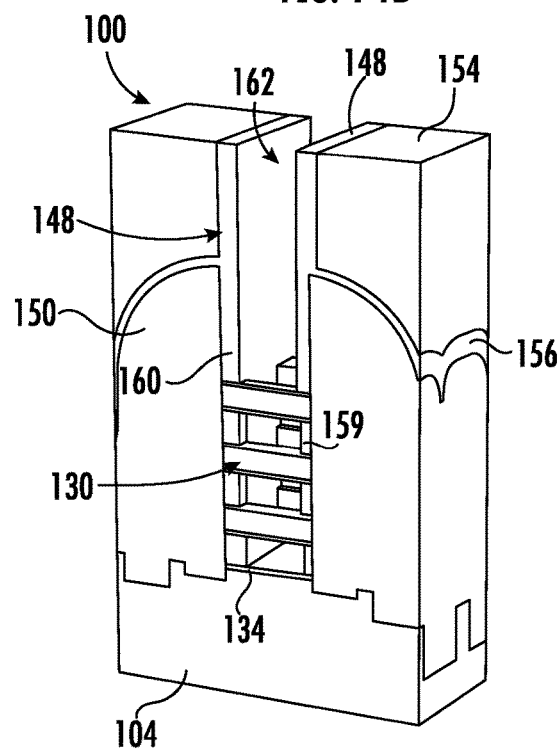

Next, as demonstrated in FIGS. 15A-15B, the gate stack 140 may then be removed between the source/drain regions 150. More specifically, the dummy pull layer 141 may be removed selective to the spacer 148 and to the stopping layer 134 coating the nanowires 130. As shown, the nanowires 130 are exposed, and extend between a first portion 159 and a second portion 160 of the spacer 148. Removing the dummy pull layer 141 provides a trench 162 in the device 100.

Figure 16A:
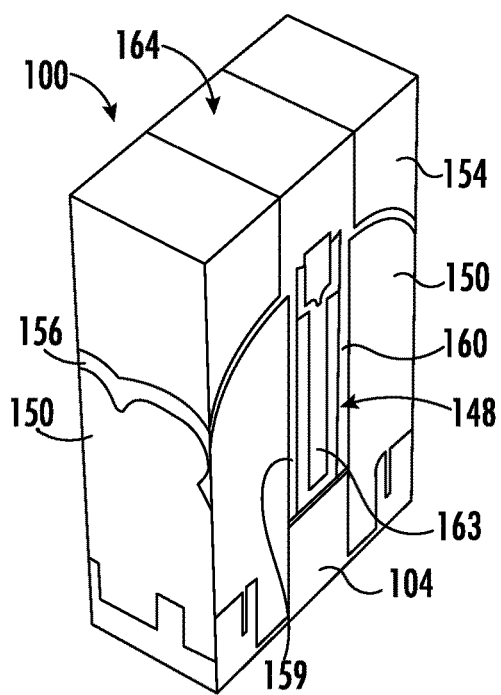
FIGS. 16A-16B depict side perspective views of the device after formation of a replacement metal gate in accordance with embodiments of the present disclosure.
Figure 16B:
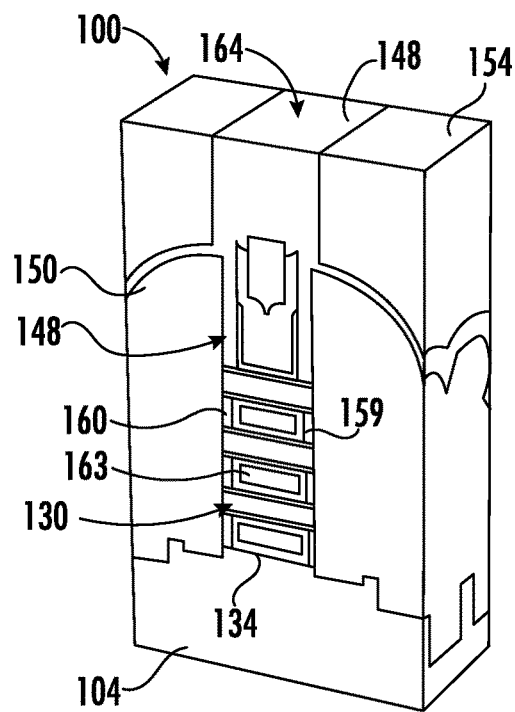

As shown in FIGS. 16A-16B, a replacement metal gate (RMG) 164 may be formed in the trench 162. In some embodiments, a metal filling process is performed that fills the trench 162 with a gate metal 163 to form respective metal gate elements. Specifically, the gate metal 163 may be formed in between each of the nanowires 130. The gate metal 163 may include various metal materials including, but not limited to, tungsten (W), tantalum (Ta), titanium (Ti), Niobium (Nb), rhenium (Rh), aluminum (Al), tungsten nitride (WN), titanium nitride (TiN) and tantalum nitride (TaN). Although non-limiting, each metal may contact a respective pair of spacers and a respective etch stop layer. In another embodiment, one or more work function metal (WFM) layers may be deposited in the trench 162 and formed on the sidewalls of the spacers before filling the trench 162 with the gate metal 163. The WFM layer may tune the threshold voltage of a resulting semiconductor device as understood by those ordinarily skilled in the art.

Figure 17A:
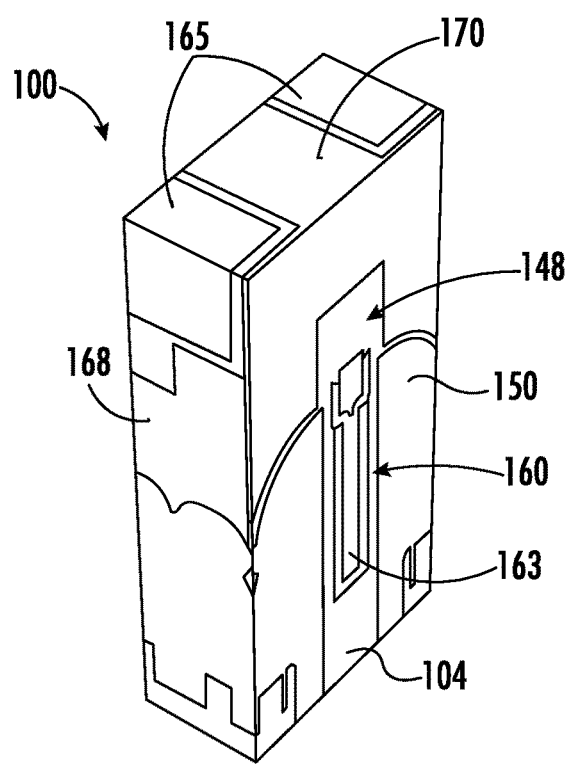
FIGS. 17A-17B depict side perspective views of the device after formation of a set of contacts in accordance with embodiments of the present disclosure.
Figure 17B:
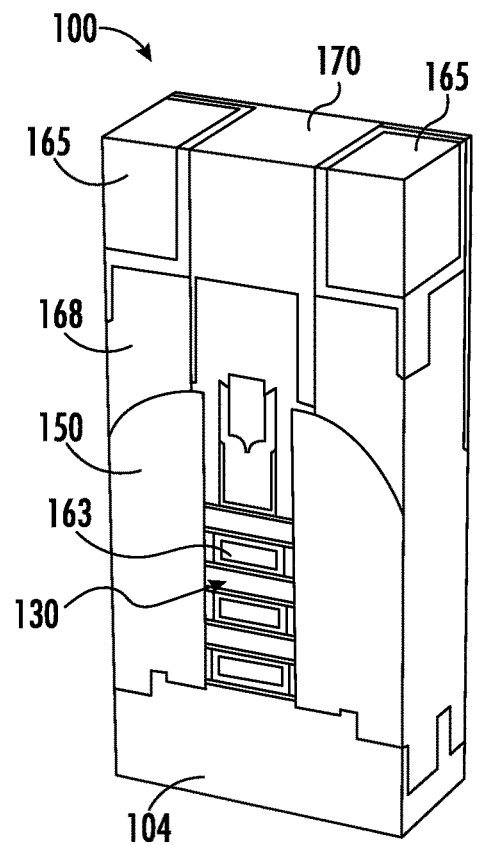

Next, as shown in FIGS. 17A-17B, a set of contacts 165 may be formed over the oxide layer 154 and the source/drain regions 150. In some embodiments, a portion of the oxide layer 154 may be removed, and a metallization layer 168 formed over the source/drain regions 150. Although non-limiting, the set of contacts 165 may be tungsten or copper. In between the set of contacts 165 may be another oxide layer 170.

Figure 18A:
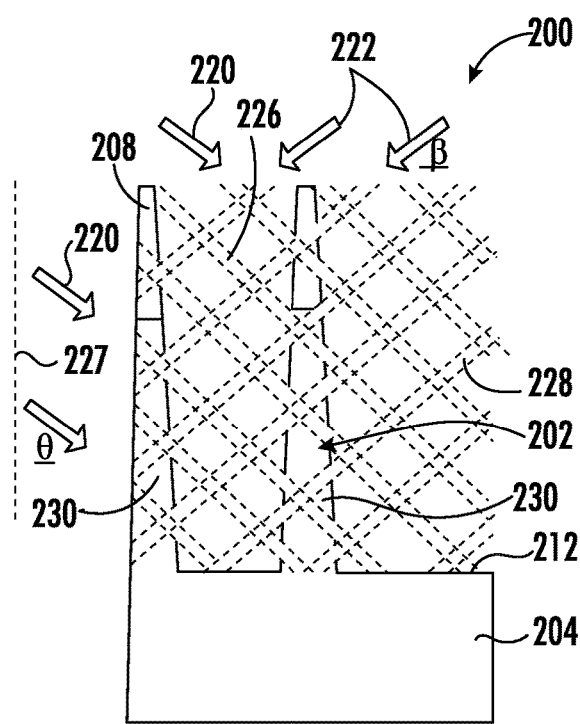
FIG. 18A depicts a side cross-sectional view of a device after formation of trenches through the device in accordance with embodiments of the present disclosure.
Figure 18B:
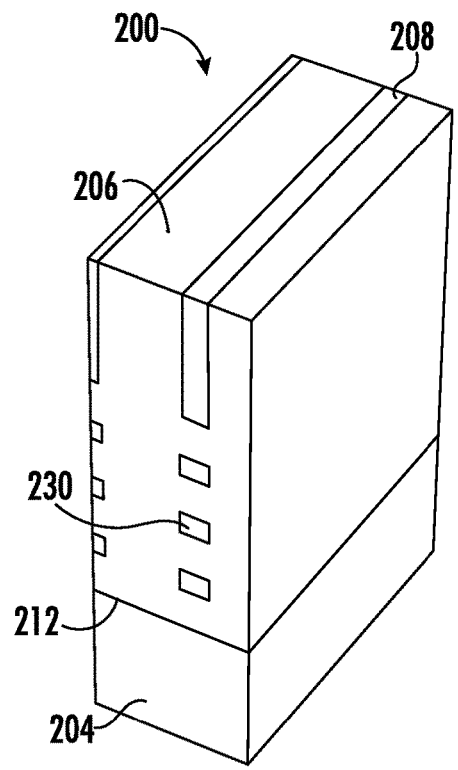
FIG. 18B depicts a perspective view of the device including a plurality of nanowires in accordance with embodiments of the present disclosure.

Turning to FIGS. 18A-18B, a device 200 according to another embodiment of the present disclosure will be described. As shown, the device 200 may include a plurality of fin structures 202 formed from a substrate 204, which may be bulk or monocrystalline silicon. A hard mask layer 208, such as silicon nitride (SiN), may be formed atop each of the fin structures 202.

In this embodiment, angled ions may be directed in a reactive ion beam etching operation, where first angled ions 220 and second angled ions 222 are provided as ion beams for performing reactive ion etching. Thus, the semiconductor material of the fin structures 202 may be preferentially etched with respect to the hard mask layer 208. In embodiments where the hard mask layer 208 is silicon nitride and the fin structures 202 are silicon, a known reactive ion etching recipe may be used to selectively etch silicon with respect to silicon nitride. As such, at least a portion of the hard mask layer 208 may be preserved during the process of FIG. 18A.

In this example, the angled ions comprise first angled ions 220, directed at a first non-zero angle of incidence θ with respect to a perpendicular 227 to a plane corresponding to a top surface 212 of the substrate 204. The angled ions also include second angled ions 222, directed at a second non-zero angle of incidence β with respect to the perpendicular 227, opposite the first non-zero angle of incidence θ. Although non-limiting, for practical applications, the absolute value for the angle of incidence (+/− with respect to the perpendicular 227) of angled ions may range between 10 degrees and 80 degrees, and in particular embodiments between 10 degrees and 50 degrees. The embodiments are not limited in this context.

As depicted in FIG. 18A, the first angled ions 220 and the second angled ions 222 form trenches 226 and trenches 228, respectively. In other embodiments, only the first angled ions 220 or the second angled ions 222 may be employed, similar to process depicted in FIG. 4B. The trenches 226, 228 are angled trenches, tending to etch through the fin structures 202 at a non-zero angle. In some embodiments, the trenches 226, 228 extend only to the top surface 212 of the substrate 204. In other embodiments, the trenches 226, 228 may remove a portion of the substrate 204. Because the mask layer 208 is etched at a much slower rate than the fin structures 202, the presence of the individual portions of the mask layer 208 act to shadow subjacent regions in the device 200. This shadowing results in defining the width of the trenches 226 and trenches 228. Notably, while just two portions of the mask layer 208 are shown in the example of FIG. 18A, other portions of the mask layer 208, extending over other fin structures 202 (not shown) are assumed to be present. The trenches 226, 228 may etch the fin structures 202 to the extent that a stack of isolated semiconductor regions, or nanowires 230, are formed in the fin structures 202. The calculated structure information about the nanowires 230 as a function of hard mask thickness and etch angle may be the same or similar to that depicted shown in FIGS. 5A-5B.

As shown in FIG. 18B, once the nanowires 230 have been formed, an STI material 206 may be formed over the device 200, including between each of the nanowires 230. Although non-limiting, the STI material 206 may be a blanket insulator, such as flowable $SiO_2$.

Figure 19A:
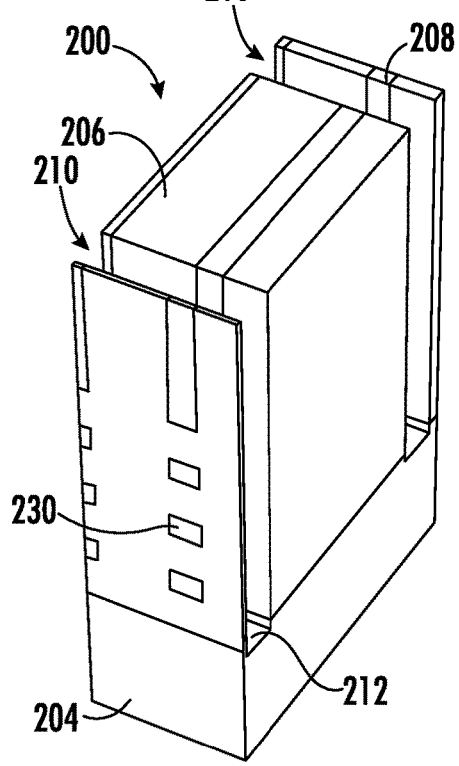
FIGS. 19A-19B depict side perspective views of the device following a fin cut in accordance with embodiments of the present disclosure.
Figure 19B:
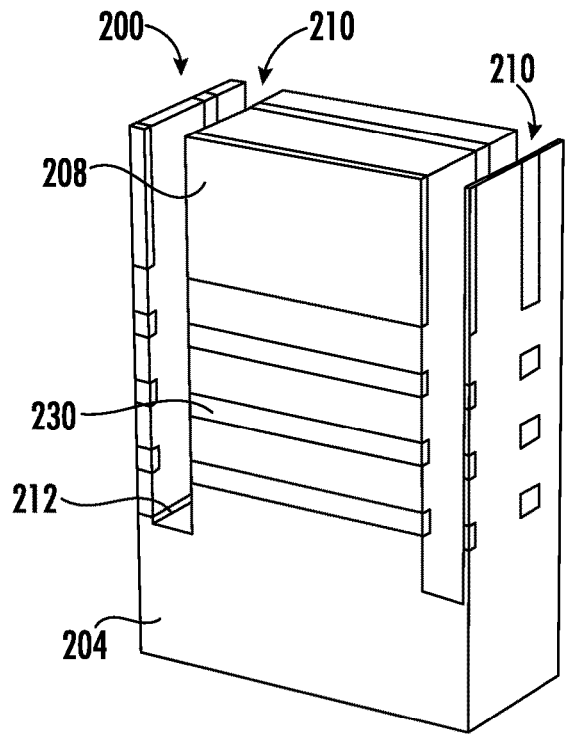
Figure 20A:
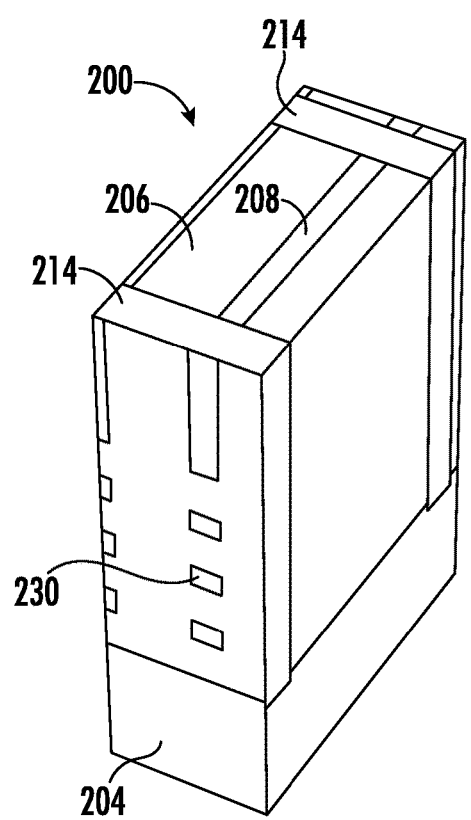
FIGS. 20A-20B depict side perspective views of the device after a dielectric material is deposited into a set of trenches in accordance with embodiments of the present disclosure.
Figure 20B:
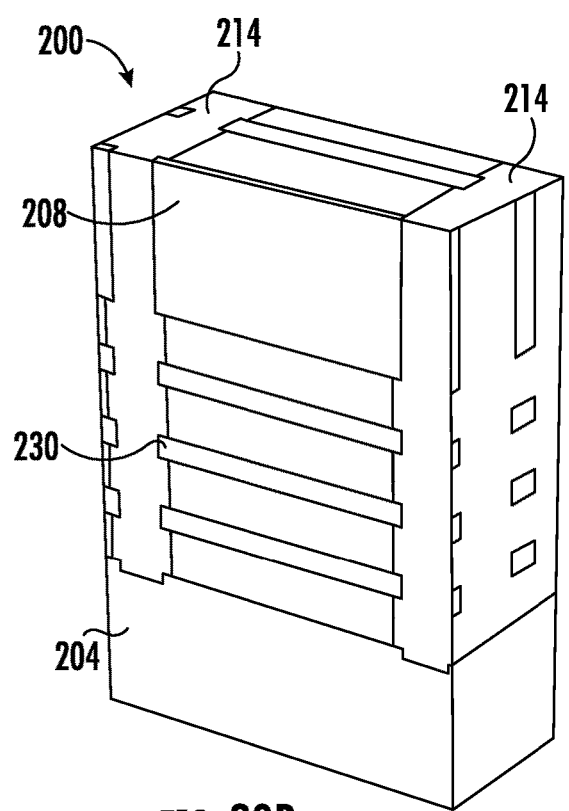

As shown in FIGS. 19A-19B, a fin cut may be performed to create a set of trenches 210 in the device 200. As shown, the set of trenches 210 may be formed through the STI material 206 and the nanowires 230, selective to the top surface 212 of the substrate 204. The set of trenches 210 may also be formed through the hard mask layer 208. In some embodiments, the trenches 210 are formed using one or more etch processes, such as a reactive ion etch (RIE). The STI material 206 may then be recessed, and a dielectric material 214 may then be deposited into the set of trenches 210 and then planarized to the configuration shown in FIGS. 20A-20B. Although non-limiting, the dielectric material 214 may be a silicon nitride (SiN) deposited within the set of trenches 210. In some embodiments, the dielectric material 214 may be recessed to the hard mask layer 208 using chemical mechanical planarization (CMP). As shown, the dielectric material 214 may extend to the top surface 212 of the substrate 204. Next, the STI material 206 may be removed from the device 200, resulting in the structure shown in FIGS. 6A-6B. The device 200 may be further processed according to the processing operations shown in FIGS. 7A-17B.

In various embodiments, design tools can be provided and configured to create the datasets used to pattern the semiconductor layers as described herein. For example, data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance running software, or implemented in hardware.

As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Although various features or elements of functionality may be individually described or claimed as separate modules, one of ordinary skill in the art will understand these features and functionality can be shared among one or more common software and hardware elements.

Furthermore, as used herein, the term "depositing" may include any now known or later developed techniques appropriate for the material to be deposited. For example, depositing may include: chemical vapor deposition (CVD), low-pressure CVD (LPCVD), plasma-enhanced CVD (PECVD), semi-atmosphere CVD (SACVD) and high density plasma CVD (HDPCVD). Depositing may further include: rapid thermal CVD (RTCVD), ultra-high vacuum CVD (UHVCVD), limited reaction processing CVD (LRPCVD), metal-organic CVD (MOCVD), sputtering deposition, and ion beam deposition. Depositing may further include: electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation.

In view of the foregoing, at least the following advantages are achieved by the embodiments disclosed herein. A first advantage includes no limits on the number of nanowires, as the nanowires are created by angled RIE on buried Si Fins. A second advantage results from the lack of inner spacer module, which leads to simpler integration because no SiGe removal is done at RMG formation. A third advantage includes no Si/SiGe supper lattice, resulting in minimal defect generation in Si channel. A fourth advantage results from no Si/SiGe intermixing with hot He implantation for STI densification. A fifth advantage includes ease of masking the SiGe channel.

The foregoing discussion has been presented for purposes of illustration and description and is not intended to limit the disclosure to the form or forms disclosed herein. For example, various features of the disclosure may be grouped together in one or more aspects, embodiments, or configurations for the purpose of streamlining the disclosure. However, it should be understood that various features of the certain aspects, embodiments, or configurations of the disclosure may be combined in alternate aspects, embodiments, or configurations. Moreover, the following claims are hereby incorporated into this Detailed Description by this reference, with each claim standing on its own as a separate embodiment of the present disclosure.

As used herein, an element or step recited in the singular and proceeded with the word "a" or "an" should be understood as not excluding plural elements or steps, unless such exclusion is explicitly recited. Furthermore, references to "one embodiment" of the present disclosure are not intended to be interpreted as excluding the existence of additional embodiments that also incorporate the recited features.

The use of "including," "comprising," or "having" and variations thereof herein is meant to encompass the items listed thereafter and equivalents thereof as well as additional items. Accordingly, the terms "including," "comprising," or "having" and variations thereof are open-ended expressions and can be used interchangeably herein.

The phrases "at least one", "one or more", and "and/or", as used herein, are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

All directional references (e.g., proximal, distal, upper, lower, upward, downward, left, right, lateral, longitudinal, front, back, top, bottom, above, below, vertical, horizontal, radial, axial, clockwise, and counterclockwise) are only used for identification purposes to aid the reader's understanding of the present disclosure, and do not create limitations, particularly as to the position, orientation, or use of this disclosure. Connection references (e.g., attached, coupled, connected, and joined) are to be construed broadly and may include intermediate members between a collection of elements and relative movement between elements unless otherwise indicated. As such, connection references do not necessarily infer that two elements are directly connected and in fixed relation to each other. Furthermore, identification references (e.g., primary, secondary, first, second, third, fourth, etc.) are not intended to connote importance or priority, but are used to distinguish one feature from another.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, although the illustrative methods described above as a series of acts or events, the present disclosure is not limited by the illustrated ordering of such acts or events unless specifically stated. For example, some acts may occur in different orders and/or concurrently with other acts or events apart from those illustrated and/or described herein, in accordance with the disclosure.

In addition, not all illustrated acts or events may be required to implement a methodology in accordance with the present disclosure. Furthermore, the methods may be implemented in association with the formation and/or processing of structures illustrated and described herein as well as in association with other structures not illustrated.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method of forming a three-dimensional transistor device, comprising:
   providing a plurality of fin structures formed from a substrate, the plurality of fin structures disposed subjacent to a hard mask layer;
   directing angled ions at the plurality of fin structures, wherein the angled ions form a non-zero angle of incidence with respect to a perpendicular to a plane of the substrate, and wherein the angled ions etch the plurality of fin structures to form a stack of isolated nanowires within the plurality of fin structures;
   removing the hard mask layer; and
   forming a stopping layer over the stack of isolated nanowires.

2. The method of claim 1, further comprising:
   providing a source trench isolation (STI) material over the plurality of fin structures;
   forming a set of trenches through the plurality of fin structures and the STI material; and
   depositing a dielectric material into the set of trenches.

3. The method of claim 1, further comprising:
   providing a source trench isolation (STI) material over the plurality of fin structures; and
   forming a set of trenches through the stack of isolated nanowires and the STI material.

4. The method of claim 1, wherein the directing the angled ions comprises:
   directing first angled ions at a first non-zero angle of incidence with respect to the perpendicular; and
   directing second angled ions at a second non-zero angle of incidence with respect to the perpendicular, opposite the first non-zero angle of incidence.

5. The method of claim 1, wherein the directing the angled ions comprises performing a reactive ion beam etching operation, and wherein the fin structures are preferentially etched with respect to the hard mask layer.

6. The method of claim 2, further comprising:
   forming a gate stack over the stack of isolated nanowires;
   removing the gate stack selective to the stopping layer formed over the stack of isolated nanowires;
   forming a spacer over the stack of isolated nanowires and the gate stack; and
   removing the spacer and the stack of isolated nanowires adjacent the gate stack.

7. The method of claim 6, further comprising:
   forming source/drain regions adjacent the gate stack;
   depositing an oxide layer over the source/drain regions; and
   removing the gate stack between the source/drain regions.

8. The method of claim 7, further comprising forming a silicon nitride layer over the source/drain regions, wherein the oxide layer is deposited atop the silicon nitride layer.

9. The method of claim 7, further comprising:
   forming a replacement metal gate over the stack of isolated nanowires; and
   forming a set of contacts over the source/drain regions.

10. A method of forming a gate device, comprising:
    providing a plurality of fin structures formed from a substrate, the plurality of fin structures disposed subjacent to a hard mask layer;
    providing a source trench isolation (STI) material over the plurality of fin structures;
    directing angled ions at the STI material and the plurality of fin structures to form a stack of isolated nanowires within the plurality of fin structures, wherein the angled ions etch the plurality of fin structures at a non-zero angle of incidence with respect to a perpendicular to a plane of the substrate;
    removing the hard mask layer and the STI material; and
    forming a stopping layer over the stack of isolated nanowires following removal of the hard mask layer and the STI material.

11. The method of claim 10, further comprising:
    forming a set of trenches through the plurality of fin structures or the stack of isolated nanowires; and
    depositing a dielectric material into the set of trenches.

12. The method of claim 10, further comprising:
    forming a gate stack over the stack of isolated nanowires, the gate stack including a dummy pull layer;
    removing the gate stack selective to the stopping layer formed over the stack of isolated nanowires;
    forming a spacer over the stack of isolated nanowires and the gate stack; and
    removing the spacer and the stack of isolated nanowires adjacent the gate stack.

13. The method of claim 10, wherein the directing the angled ions comprises:
    directing first angled ions at a first non-zero angle of incidence with respect to the perpendicular; and
    directing second angled ions at a second non-zero angle of incidence with respect to the perpendicular, opposite the first non-zero angle of incidence.

14. The method of claim 10, wherein the directing the angled ions comprises performing a reactive ion beam etching operation, wherein the fin structures are preferentially etched with respect to the hard mask layer.

15. The method of claim 12, further comprising:
    forming source/drain regions adjacent the gate stack;

depositing an oxide layer over the source/drain regions; and removing the gate stack between the source/drain regions.

16. The method of claim 15, further comprising:

forming a replacement metal gate over the stack of isolated nanowires; and forming a set of contacts over the source/drain regions.

17. A semiconductor device, comprising:

a substrate;

a stack of isolated nanowires disposed over the substrate, each of the stack of isolated nanowires extending between first and second portions of a spacer;

a stopping layer directly atop each of the stack of isolated nanowires; and a replacement metal gate disposed over the stack of isolated nanowires and the stopping layer, wherein a metal of the replacement metal gate is disposed in between each nanowire of the stack of isolated nanowires.

18. The semiconductor device of claim 17, further comprising:

source/drain regions disposed adjacent the stack of isolated nanowires;

an oxide layer over the source/drain regions; and a set of contacts formed over the oxide layer and the source/drain regions.

19. The semiconductor device of claim 17, wherein each nanowire of the stack of isolated nanowires extends parallel to one another.

20. The semiconductor device of claim 17, wherein the substrate and the stack of isolated nanowires are silicon.

* * * * *